United States Patent
Posthuma et al.

(10) Patent No.: US 7,964,789 B2
(45) Date of Patent: *Jun. 21, 2011

(54) GERMANIUM SOLAR CELL AND METHOD FOR THE PRODUCTION THEREOF

(75) Inventors: Niels Posthuma, Leuven (BE); Giovanni Flamand, Wijnegem (BE); Jef Poortmans, Kessel-lo (BE)

(73) Assignees: IMEC, Leuven (BE); Umicore NV, Brussels (BE)

( * ) Notice: Subject to any disclaimer, the term of this patent is extended or adjusted under 35 U.S.C. 154(b) by 1471 days.

This patent is subject to a terminal disclaimer.

(21) Appl. No.: 10/841,803

(22) Filed: May 6, 2004

(65) Prior Publication Data
US 2005/0000566 A1 Jan. 6, 2005

Related U.S. Application Data

(60) Provisional application No. 60/468,752, filed on May 7, 2003.

(51) Int. Cl.
H01L 31/00 (2006.01)
(52) U.S. Cl. .................................... 136/261
(58) Field of Classification Search ........... 136/261
See application file for complete search history.

(56) References Cited

U.S. PATENT DOCUMENTS

| | | | |
|---|---|---|---|
| 4,319,395 A | 3/1982 | Lund et al. | |
| 4,468,853 A | 9/1984 | Morita et al. | |
| 4,473,597 A | 9/1984 | Pankove et al. | |
| 4,602,120 A * | 7/1986 | Wakefield et al. | 136/256 |
| 4,742,384 A * | 5/1988 | Pankove et al. | 257/646 |
| 4,773,942 A * | 9/1988 | Hamakawa et al. | 136/244 |
| 4,926,229 A * | 5/1990 | Nakagawa et al. | 136/265 |
| 5,246,744 A * | 9/1993 | Matsuda et al. | 427/574 |
| 5,437,736 A | 8/1995 | Cole | |
| 6,210,991 B1 * | 4/2001 | Wenham et al. | 438/97 |
| 6,326,540 B1 * | 12/2001 | Kilmer et al. | 136/252 |
| 6,339,013 B1 | 1/2002 | Naseem et al. | |
| 6,982,218 B2 | 1/2006 | Preu et al. | |
| 2002/0007793 A1 | 1/2002 | Sakai et al. | |
| 2003/0003693 A1 * | 1/2003 | Meier et al. | 438/476 |
| 2003/0124761 A1 | 7/2003 | Baert et al. | |

(Continued)

FOREIGN PATENT DOCUMENTS

GB 1355890 * 6/1974

(Continued)

OTHER PUBLICATIONS

D. K. Schroder, D.L. Meier, "Solar Cell Contact Resistance—A Review", IEEE Transactions on Electron Devices, vol. ED-31 (5), p. 637-647 (1984).*

(Continued)

Primary Examiner — Alexa D Neckel
Assistant Examiner — Miriam Berdichevsky
(74) Attorney, Agent, or Firm — Knobbe Martens Olson & Bear LLP

(57) ABSTRACT

A method is disclosed for passivating and contacting a surface of a germanium substrate. A passivation layer of amorphous silicon material is formed on the germanium surface. A contact layer of metal is then formed on the passivation. The structure is heated so that the germanium surface makes contact with the contact layer. Thus, a passivated germanium surface is disclosed, as well as a solar cell comprising such a structure.

15 Claims, 5 Drawing Sheets

U.S. PATENT DOCUMENTS

2003/0211704 A1    11/2003    Shaheen et al.

FOREIGN PATENT DOCUMENTS

| JP | 56-155526 | | 12/1981 | |
|---|---|---|---|---|
| JP | 05048127 A | * | 2/1993 | ............ 136/258 |
| WO | WO 89/12321 A1 | | 6/1990 | |
| WO | WO 01/74708 A2 | | 10/2001 | |

OTHER PUBLICATIONS

Yong Liu, "High Growth Rate Deposition of Hydrogenated Amorphous Silicon-Germanium Films and Devices Using ECR-PECVD", Ph.D. thesis, Electrical Engineering (Microelectronics), Major Professor: Vikram Dalal, OSTI ID: 803355, Iowa State University, Ames, IA (2002).*

Nguyen Van Dong, Y. Fomier and J.Y. Le "Electrical and optical properties of sputtered amorphous silicon films prepared under a reduced pumping speed," Applied Physics Letters 42 (7), p. 594-596 (1983).*

Witvrouw, et al.; Microsystem Technologies 6 (2000) 192-199; "Why CMOS-integrated transducers? A review."

Singh, et al.; Sensors and Actuators 77 (1999) 133-138; "Strain studies in LPCVD polysilicon for surface micromachined devices."

Lin et al; J. Electrochem. Soc., vol. 141, No. 9, Sep. 1994, 2559-2563; "Effects of $SiH_4$, $GeH_4$, and $B_2H_6$ on the Nucleation and Deposition of Polycrystalline $Si_{1-x}Ge_x$ Films."

King, et al.; J. Electrochem. Soc., vol. 141, No. 8, Aug. 1994, 2235-2240; "Deposition and Properties of Low-Pressure Chemical-Vapor Deposited Polycrystalline Silicon-Germanium Films".

Luke et al., 'Germanium Orthogonal Strip detectors with Amorphous-Semiconductor contacts', 1999 IEEE Nuclear Science Symposium Conference Record, Seattle WA, Oct. 25-28, 1999.

Luke et al., "Germanium Orthogonal Strip Detectors with Amorphous Semiconductor Contacts", 2000 IEEE, pp. 201-204.

* cited by examiner

GERMANIUM SOLAR CELL AND METHOD FOR THE PRODUCTION THEREOF

RELATED APPLICATIONS

This application claims the benefit of priority under 35 U.S.C. §119(e) to U.S. provisional application 60/468,752 filed on May 7, 2003, which is incorporated by reference.

BACKGROUND

1. Field of the Invention

The present invention is related to the field of germanium solar cells, germanium photovoltaic cells and germanium photodetectors.

2. Related Technology

To achieve solar cells that convert energy with efficiencies up to 40 percent, quadruple junctions are being investigated. Realizing such cells is relevant for instance for space applications, because the total array weight and thus the launching cost can be reduced by increasing the energy conversion efficiency. For terrestrial applications the use of such cells results in a decrease of the total amount of cost per Watt, if the sunlight is concentrated.

Currently, double and triple junction cells are being fabricated by several companies using monolithically stacked cells, where germanium is used as a substrate material as well as an active layer. Realizing monolithically stacked four junction cells and optimizing the current matching for obtaining a high-energy conversion at the end of life (EOL) is quite complex, considering that the various junctions degrade at a different rate.

To lessen the need for current matching, it is interesting to look at the possibility of mechanical stacking of cells. A four terminal stack consisting of a top cell of two junctions in combination with a separate bottom cell is a good compromise between interconnection complexity and growth complexity. Germanium is a suitable material for realizing this bottom cell, because of its low energy band gap, low weight and relatively low substrate cost.

A stand-alone germanium cell can be used as a bottom cell as a part of a high efficient multi-junction solar cell.

Furthermore a germanium cell is—on itself—an interesting option for use as a receiver in a Thermo Photo-Voltaic (TPV) system, where it is used to convert specific radiation from a heat source. The use of germanium in a TPV system is especially interesting because of its relatively low substrate cost compared to other low band gap semiconductors like GaSb. In order to make the application of the germanium solar cell in a TPV system feasible, it will also be essential to keep the processing costs to a minimum.

The main problem of the current realized germanium cells is the need for good passivation of the front and backside. A good front side passivation is especially critical in germanium cells, because Ge has a quite high absorption coefficient, which causes the light to be absorbed close to the surface and thus makes the device extremely sensitive to recombination at the surface.

Surface passivation can be realized by applying a certain material on the surface, which fills the dangling bonds and thereby reduces the amount of recombination centers at this surface. For example, materials like silicon oxide, silicon nitride or amorphous semiconductors can be used. These layers can be applied by techniques like chemical vapor deposition (CVD) or sputtering. Depending on the chosen method significant differences in material properties and passivation behavior can be obtained. Especially important with respect to passivation are the amount of hydrogen in the layer and the damage to the surface that is caused by the deposition technique.

Document EP-A-374244 is related to a method of fabricating a solar cell from a silicon substrate on which a passivation layer consisting of Silicon Nitride is applied, after which contacts are created by applying a silver containing paste onto the passivation layer and 'firing through' the contacts, i.e. subjecting the substrate to a diffusion step, so that silver particles penetrate the silicon nitride layer and make contact with the substrate. The process conditions and the materials chosen for this process are however unsuitable for a Germanium substrate.

In P. N. Luke et al., 'Germanium Orthogonal Strip detectors with Amorphous-Semiconductor contacts', 1999 IEEE Nuclear Science Symposium Conference Record, Seattle Wash., 25-28 Oct. 1999, a contact layer of amorphous germanium with thickness of 100 nm is sputtered onto the surface of a Germanium detector. The amorphous semiconductor layer functions as a blocking junction and acts as a passivation coating for the germanium surface. The provision of contacts as required for solar cells is not discussed.

The formation of contacts after the passivation of a germanium solar cell front side is not obvious. The properties of the germanium substrate and possibly passivation layer should not be altered significantly during this process, which limits process conditions as for instance processing temperatures (preferably kept below 300° C.).

SUMMARY OF CERTAIN INVENTIVE ASPECTS

Various inventive aspects provide a novel method for passivating and contacting a germanium surface. The germanium surface is preferably a surface of a germanium solar cell, a germanium thermo photovoltaic cell or a germanium photodetector. It can be, for instance, the front or back surface of the solar cell.

Other inventive aspects provide a novel highly efficient germanium solar cell and a method for producing such a cell.

A first embodiment of the present invention discloses a novel method for passivating and contacting a germanium surface. Preferably the germanium surface is a surface of a germanium solar cell.

The method according to the first embodiment of the present invention comprises a) providing a germanium substrate with a first surface; this germanium surface can be doped or undoped; b) depositing a layer of amorphous silicon on top of the germanium surface. Advantageously plasma enhanced chemical vapor deposition (PECVD) is used for deposition. Other state of the art techniques are possible. Preferably, the thickness of the layer is less than 500 nm. More preferably, the thickness of the layer is less than 300 nm. Even more preferably, the thickness of the layer is below 100 nm. Most preferably, the thickness of the layer is below 40 nm. Advantageously for efficient solar cell applications, the thickness of the layer is from 10 to 40 nm, e.g. 10 nm, 15 nm, 20 nm, 25 nm, 30 nm, 35 nm or 40 nm. Of particular note are the cleaning treatment preceding the deposition, gas flow composition and applied RF-power for realizing the plasma. Preferably, the PECVD is performed at a wafer temperature between 150° C. and 250° C. or 300° C., e.g., 150° C., 160° C., 170° C., 180° C., 190° C., 200° C., 210° C., 220° C., 230° C., 240° C., 250° C., 275° C., 300° C. A higher deposition temperature results in out-diffusion of the hydrogen within the material, which subsequently results in less desirable passivation properties; c) depositing a patterned layer of metal on top of the layer of amorphous silicon. This can be done by any state of the art technique. Preferably the metal is a highly conductive metal like Ag or Au. This step can comprise different sub steps. This layer can be patterned to form a contact grid; and d) "Firing through" or diffusion of the metal through the layer of amorphous silicon by applying a temperature step, such that the germanium surface is contacted. The diffusion step should be chosen such that the process can be controlled. The effect of the diffusion or fire through is that metal particles of the contact layer penetrate through the amorphous silicon passivation layer to form a conductive path between the contact and the Ge-substrate. The resulting contacting resistivity is preferably lower than $5.10^{-4}$ $\Omega cm^2$, more preferably lower than $10^{-4}$ $\Omega cm^2$, most preferably lower than $10^{-5}$ $\Omega cm^2$. The quality of the passivation layer is strongly affected by the cleaning treatment preceding the deposition. For instance a $H_2$ plasma can be used to prepare the surface.

In FIG. 5 the measured effective minority carrier lifetime is plotted in function of the duration of the exposure time of the substrate to the H2 plasma during the preliminary cleaning step. The amount of exposure plays a significant role in the optimization of the solar cell efficiency.

A further improvement of the quality of the passivation is achieved by optimizing the layer thickness. A too thin layer results in lower quality passivation properties, while a too thick layer absorbs a bigger part of the solar spectrum. For application in a mechanically stacked solar cell, or in a TPV cell the restrictions concerning the thickness are less stringent since in these applications the part of the spectrum that is used by the germanium cell will not be absorbed in the amorphous silicon layer.

In a first aspect of the first embodiment of the present invention, the method can be used for the production of a germanium solar cell. The method according to the first aspect of the first embodiment of the present invention comprises the following steps (FIG. 1).

1. Providing a p-type (or alternatively n-type) germanium substrate (1);

2. (A) Formation of the emitter ($n^+$ region, 2) in the p-type germanium substrate, by means of diffusion using a source of spin-on dopant (3) (SOD, preferably comprising phosphorous (P), e.g. $PH_3$). A possible alternative is the reversed situation with a $p^+$ emitter in the n-type substrate. The most relevant parameters are the diffusion time, diffusion temperature, diffusion atmosphere and the phosphorous content of the SOD. The diffusion temperature is preferably between 500 and 700° C. More preferably a temperature of about 600° C. is used. The diffusion time is preferably between 10 seconds and 20 minutes. More preferably a diffusion time of about 30 seconds is used. The diffusion atmosphere is preferably a forming gas as $N_2+H_2$ (10%). Subsequent to the diffusion the spin-on material is removed using an HF solution.

3. (B) Application of the back contact (4) and realization of the back-surface field (BSF), using preferably aluminum applied by evaporation. Subsequently the Al is diffused into the substrate by applying a temperature step in forming gas (preferably $N_2+H_2$(10%)) to create a $p^+$ zone that serves as a back surface field (BSF) (5). Preferably an about 1 μm thick aluminum layer is evaporated. The diffusion temperature is preferably between 350 and 600° C. The diffusion time is preferably between 10 minutes and 60 minutes. The diffusion atmosphere is preferably a forming gas as $N_2+H_2$ (10%).

4. (C) Defining the solar cell area by etching the MESA structures.

5. (D) Passivation of the front side by applying a very thin layer of intrinsic hydrogenated amorphous silicon (Si:H) (6) using plasma enhanced chemical vapor deposition (PECVD). Preferably the surface is prepared by applying a $H_2$ plasma, inside the deposition chamber, performed just before the deposition of the amorphous silicon. Preferably the applied RF power is less than 50 Watt. More preferably the power is less than 15 Watt. The exposure time is preferably less than 2 minutes; more preferably the exposure time can be chosen between 30 and 45 seconds. Preferably the thickness of the layer is less than 100 nm. More preferably a thickness of smaller then 40 nm or 50 nm can be chosen. For solar cell applications, a thickness of 10 to 40 or 50 nm can be advantageous. Thicker layers would absorb too much light, which can be disadvantageous when a high efficiency of a solar cell is important. Critical gas flow composition and applied RF-power for realizing the plasma. Preferably the PECVD is performed at a wafer temperature between 150 and 250° C. Preferably the plasma is between 6 and 20 Watts. Preferably the gas composition comprises 20 to 100 sccm $SiH_4$ and 0 to 600 sccm $H_2$.

6. Application of the front contact by:

i. evaporation of the metal, preferably silver (Ag) or gold (Au) contact structure (E), using preferably lift-off to define the finger pattern (F,7). For instance an about 2 μm thick metal layer can be used.

ii. (G) firing through the amorphous silicon layer of the applied metal contacts (diffusion of the metal through the passivating amorphous silicon layer) in order to obtain a good contact with the $n^+$ germanium emitter. Critical are the diffusion time and temperature. The diffusion temperature is preferably between 150 and 300° C., for instance 250° C. More preferably a temperature between 160 and 220° C. is used. The diffusion time is preferably between 5 min and 60 min. Depending of the thickness of the passivation layer, the optimal diffusion time will change. The diffusion atmosphere is preferably a forming gas as (N2+H2 (10%)).

7. (H) Evaporation of the anti-reflective coating (8) using preferably zinc sulfide (ZnS) and magnesium fluoride ($MgF_2$).

In a second embodiment, a method of passivating and contacting a surface of a germanium substrate is provided, including: (a) providing a germanium substrate having a first surface; (b) forming a passivation layer of amorphous silicon material on the first surface; (c) forming a contact layer of metal on the passivation layer; (d) heating the substrate and layers so that the first surface makes contact with the contact layer through the passivation layer.

In an aspect of the second embodiment, the contact resistivity is less than about $10^{-4}$ $\Omega cm^2$.

In an aspect of the second embodiment, the method further includes cleaning the first surface before forming the passivation layer, the cleaning including applying a $H_2$ containing plasma to the first surface.

In an aspect of the second embodiment, the forming the passivation layer is performed by plasma enhanced chemical vapor deposition (PECVD).

In an aspect of the second embodiment, the PECVD is performed at a temperature of from about 150° C. to about 300° C.

In an aspect of the second embodiment, the passivation layer has a thickness of less than about 100 nm.

In an aspect of the second embodiment, the passivation layer has a thickness of less than about 40 nm.

In an aspect of the second embodiment, the passivation layer has a thickness of from about 10 nm to about 50 nm.

In an aspect of the second embodiment, the first surface is a surface of a germanium solar cell, a thermophotovoltaic cell or a photodetector.

In an aspect of the second embodiment, the contact layer includes Ag or Au.

In an aspect of the second embodiment, the contact layer is patterned to form a contact grid.

In an aspect of the second embodiment, the heating is performed at a temperature lower than about 300° C.

In an aspect of the second embodiment, the heating is performed at a temperature of from about 160° C. to about 220° C.

In an aspect of the second embodiment, the method further includes (a) forming an emitter area in the germanium substrate; (b) forming a back contact on a second surface of the germanium substrate and thereby realizing a back surface field; (c) etching mesa structures so as to define photo voltaic cell regions; and (d) forming an antireflective coating on the exposed parts of the passivation layer and the contact layer.

In an aspect of the second embodiment, the forming of an emitter area, forming a back contact, and etching mesa structures are performed before forming a passivation layer.

In an aspect of the second embodiment, the forming an antireflective coating is performed after the heating.

In a third embodiment, a passivated germanium substrate is provided, including a germanium substrate including a first surface; a passivation layer of plasma enhanced chemical vapor deposition (PECVD) deposited amorphous silicon material formed on the first surface; and a metal contacting layer on the passivation layer contacting the substrate through the passivation layer, by particles of the metal having penetrated into the passivation layer and thereby having formed a conductive path between the contacting layer and the germanium substrate.

In an aspect of the third embodiment, the passivation layer includes a conductive material in an area underlying the contacting layer and between the contacting layer and the germanium substrate.

In an aspect of the third embodiment, the passivation layer has a thickness of from about 10 to about 40 nm.

In a fourth embodiment, a photovoltaic device is provided including a germanium substrate including a first surface; a passivation layer of plasma enhanced chemical vapor deposition (PECVD) deposited amorphous silicon material formed on the first surface; and a contacting layer including a conductive material formed on the passivation layer.

BRIEF DESCRIPTION OF THE FIGURES

FIG. 3 illustrates the internal quantum efficiency, the external quantum efficiency and the reflectance of a solar cell created by a preferred embodiment of the present invention, in function of the wavelength of the incoming light. The good quality of the passivation layer is shown by the excellent response at low wavelengths.

DETAILED DESCRIPTION OF CERTAIN INVENTIVE EMBODIMENTS

Figure 1:
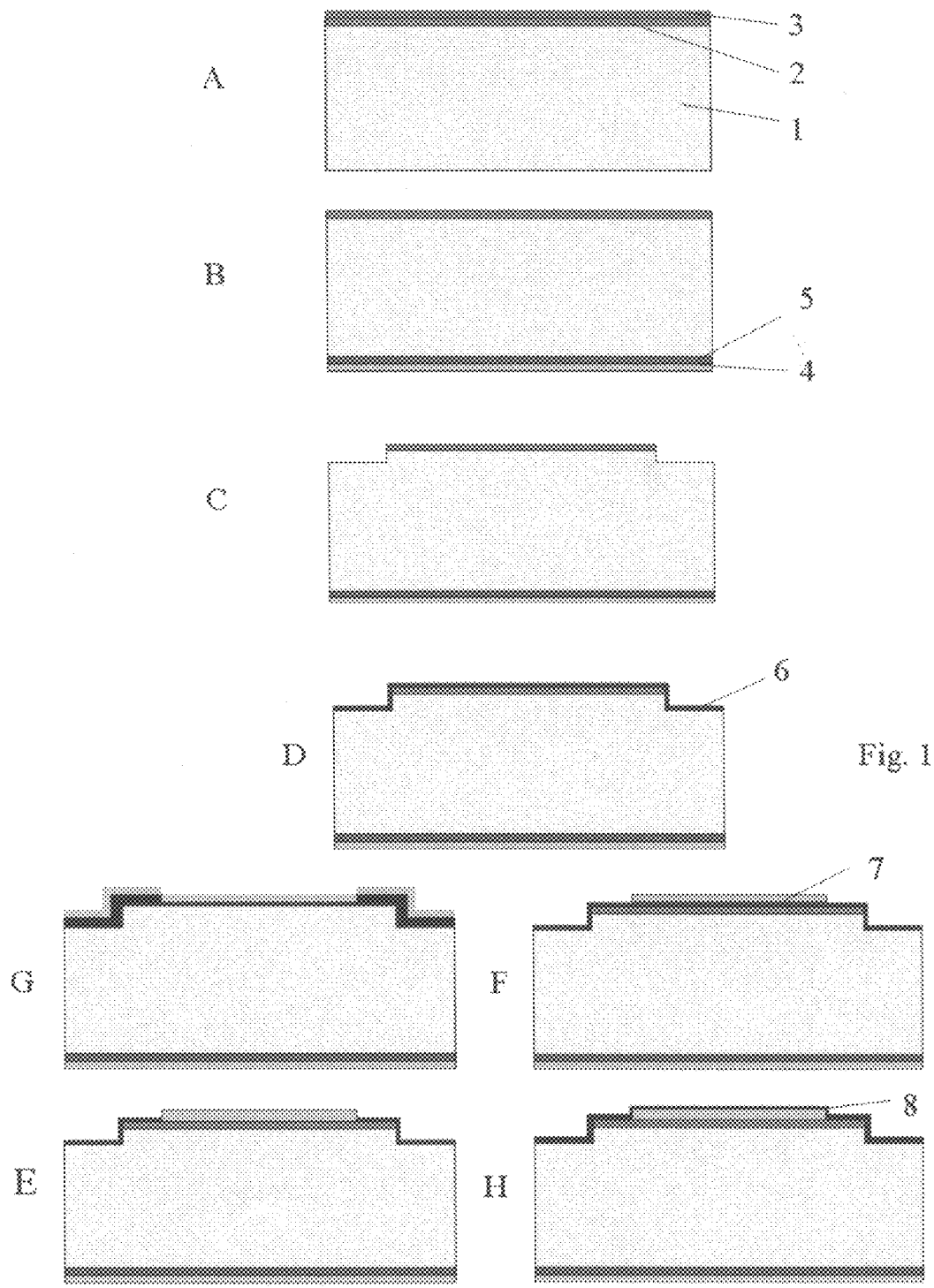
FIG. 1 illustrates an embodiment of the present invention whereby a germanium solar cell is produced, passivated by the method according to the present invention (FIG. 1).

A preferred embodiment of the method according to the present invention for the production of a germanium solar cell comprises the steps (FIG. 1):

1. Providing a p-type germanium substrate (1).
2. (A) Formation of the emitter (n$^+$ region, 2) in the p-type germanium substrate, by means of diffusion using a source of spin-on dopant (3) (PH$_3$). A diffusion temperature of 600° C. and a diffusion time of 30 seconds were used. The diffusion atmosphere was a forming gas, N$_2$+H$_2$ (10%).
3. (B) Application of the back contact (4) and realization of the back-surface field (BSF) (5), using aluminum applied by evaporation. Subsequently the Al is diffused into the substrate by applying a temperature step in forming gas (N$_2$+H$_2$(10%)) to create a p$^+$ zone that serves as a back surface field (BSF) (5). A 1 µm thick aluminum layer was evaporated. The diffusion temperature was between 350 and 600° C. The diffusion time is between 10 minutes and 60 minutes. The diffusion atmosphere is a forming gas N2+H2 (10%).
4. (C) Defining the solar cell area by etching the MESA structures.
5. (D) Passivation of the front side by applying a very thin layer of intrinsic hydrogenated amorphous silicon (Si:H) (6) using plasma enhanced chemical vapor deposition (PECVD) at a substrate temperature of 170° C. A layer with thickness of 10 nm was deposited. The plasma power was between 6 and 20 Watts. The gas composition was comprised between 20 to 100 sccm SiH$_4$ and between 0 to 600 sccm H$_2$.
6. Application of the front contact by:
    i. evaporation of the silver (Ag) contact structure (E), using lift-off to define the finger pattern (F,7). The lift off comprised selectively depositing a resist layer on the layer of amorphous silicon before the Ag deposition. After the following Ag deposition the resist is removed—together with the Ag deposited on the resist, such that only the area were no resist had been applied remain covered with Ag. A 2 µm thick silver layer was used.
    ii. (G) firing through the amorphous silicon layer of the applied Ag contacts (diffusion of silver through the passivating amorphous silicon layer) in order to obtain a good contact with the n$^+$ germanium emitter. Critical are the diffusion time and temperature. A diffusion temperature of 250° C. and a diffusion time of about 20 minutes were used. The diffusion atmosphere was a forming gas (N2+H2 (10%)).
7. (H) Evaporation of the anti-reflective coating (8) using zinc sulfide (ZnS) and magnesium fluoride (MgF$_2$).

Figure 2:
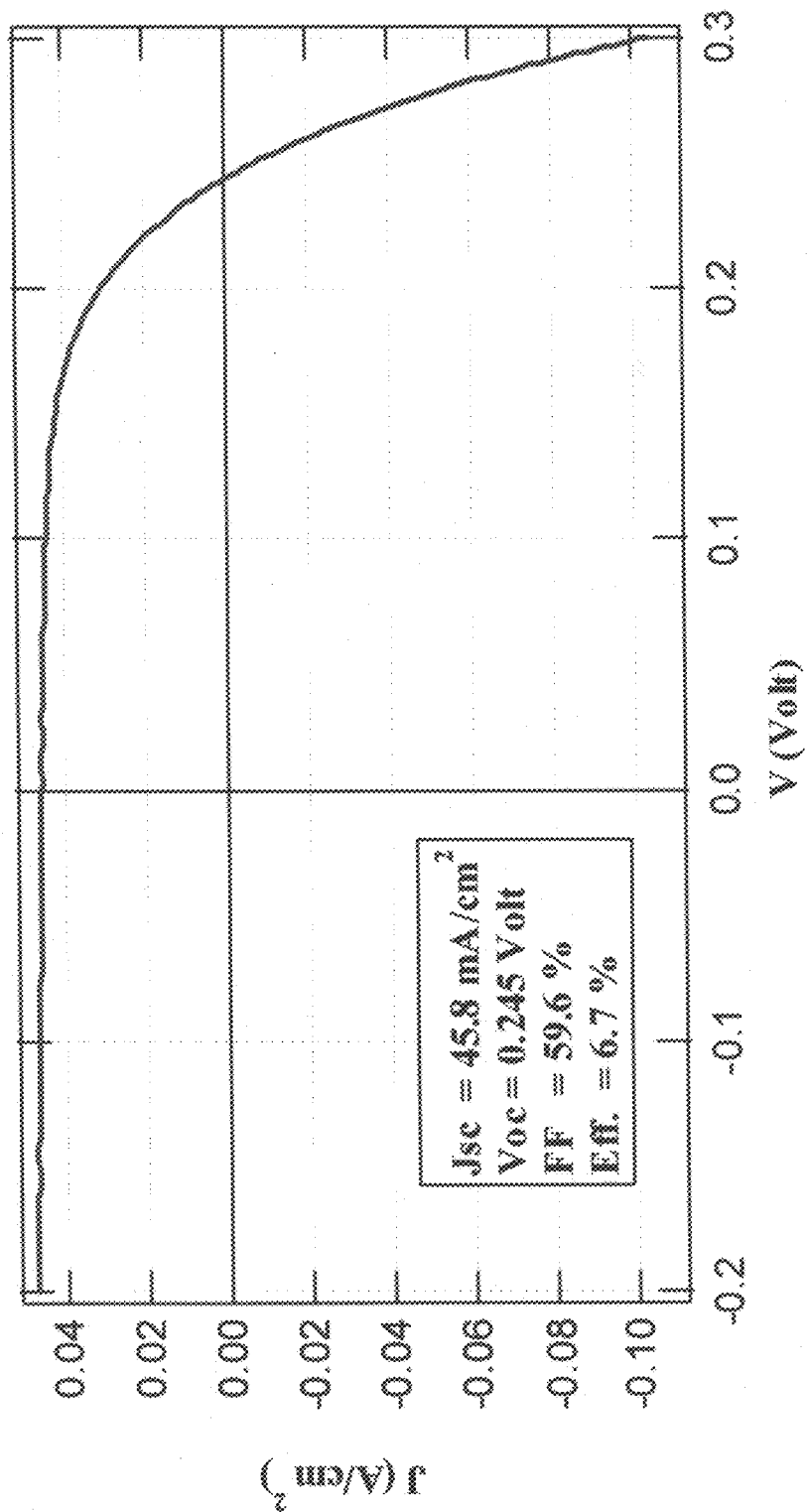
FIGS. 2 and 3 illustrate the performance of a solar cell according to a preferred embodiment of the present invention. As shown in the current-voltage characteristic shown in FIG. 2, the short circuit current ($J_{sc}$) is equal to 45.8 mA/cm$^2$, the open circuit voltage Voc is equal to 245 mV and the fill factor (FF) was found to be 59.6%. An AM1.5 efficiency of 6.7% was measured.
Figure 3:
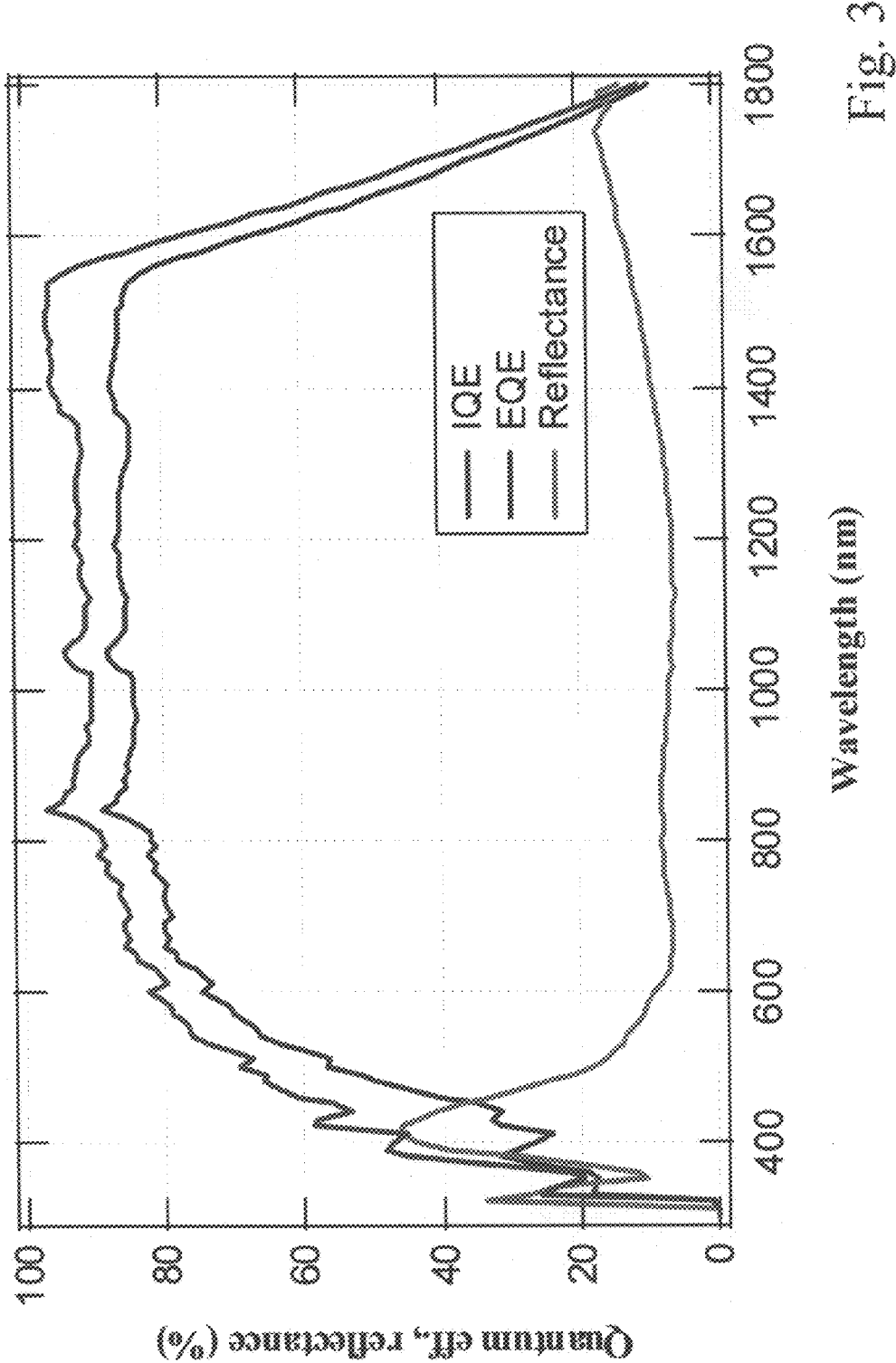

FIGS. 2 and 3 illustrate the performance of a solar cell according to a preferred embodiment of the present invention. As shown in the current-voltage characteristic shown in FIG. 2, the short circuit current ($J_{sc}$) is equal to 45.8 mA/cm$^2$, the open circuit voltage Voc is equal to 245 mV and the fill factor (FF) was found to be 59.6%. An AM1.5 efficiency of 6.7% was measured.

FIG. 3 illustrates the internal quantum efficiency, the external quantum efficiency and the reflectance of a solar cell created by a preferred embodiment of the present invention, in function of the wavelength of the incoming light.

Figure 4:
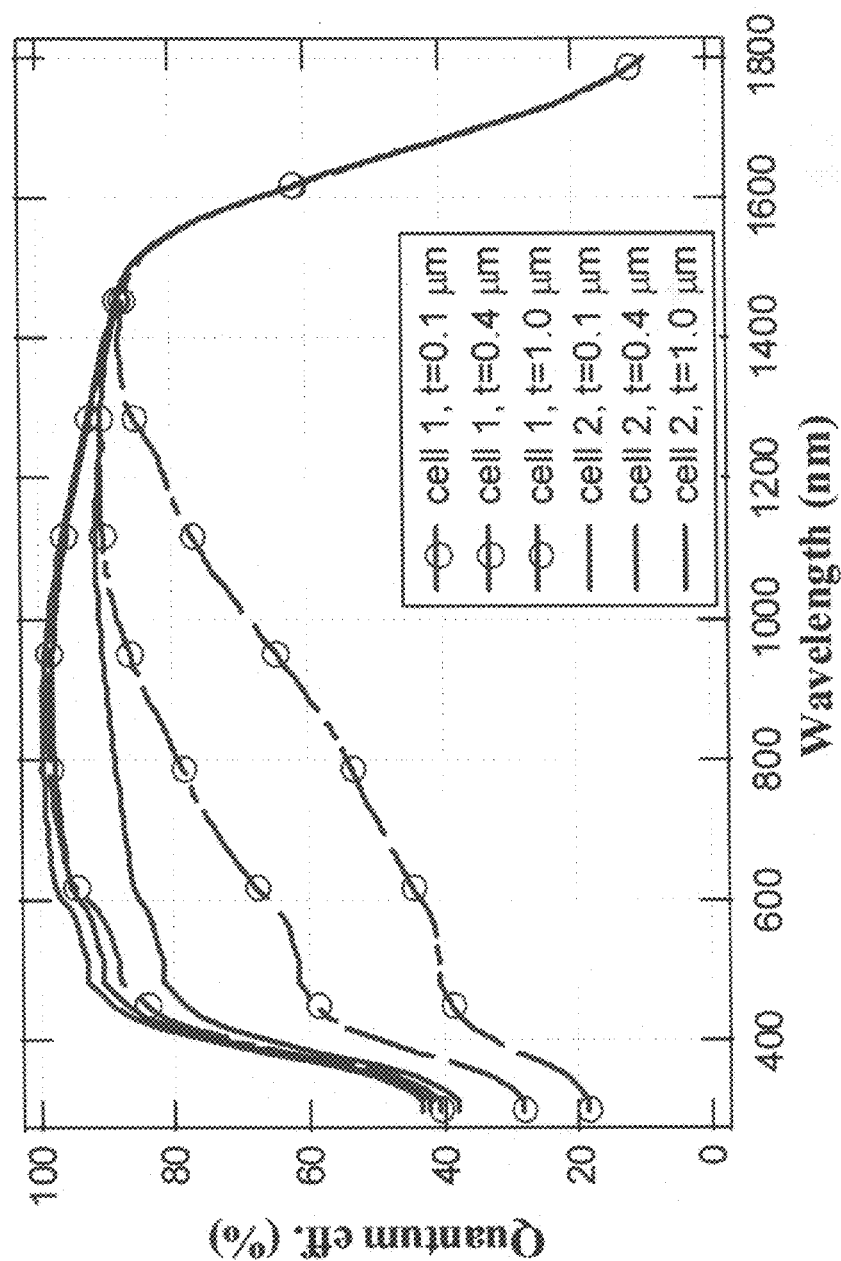
FIG. 4 shows simulation results were the emitter thickness and surface recombination velocities have been varied, In FIG. 5 the carrier lifetime is plotted in function of the duration of the exposure time of the substrate to the $H_2$ plasma during the preliminary cleaning step.
Figure 5:
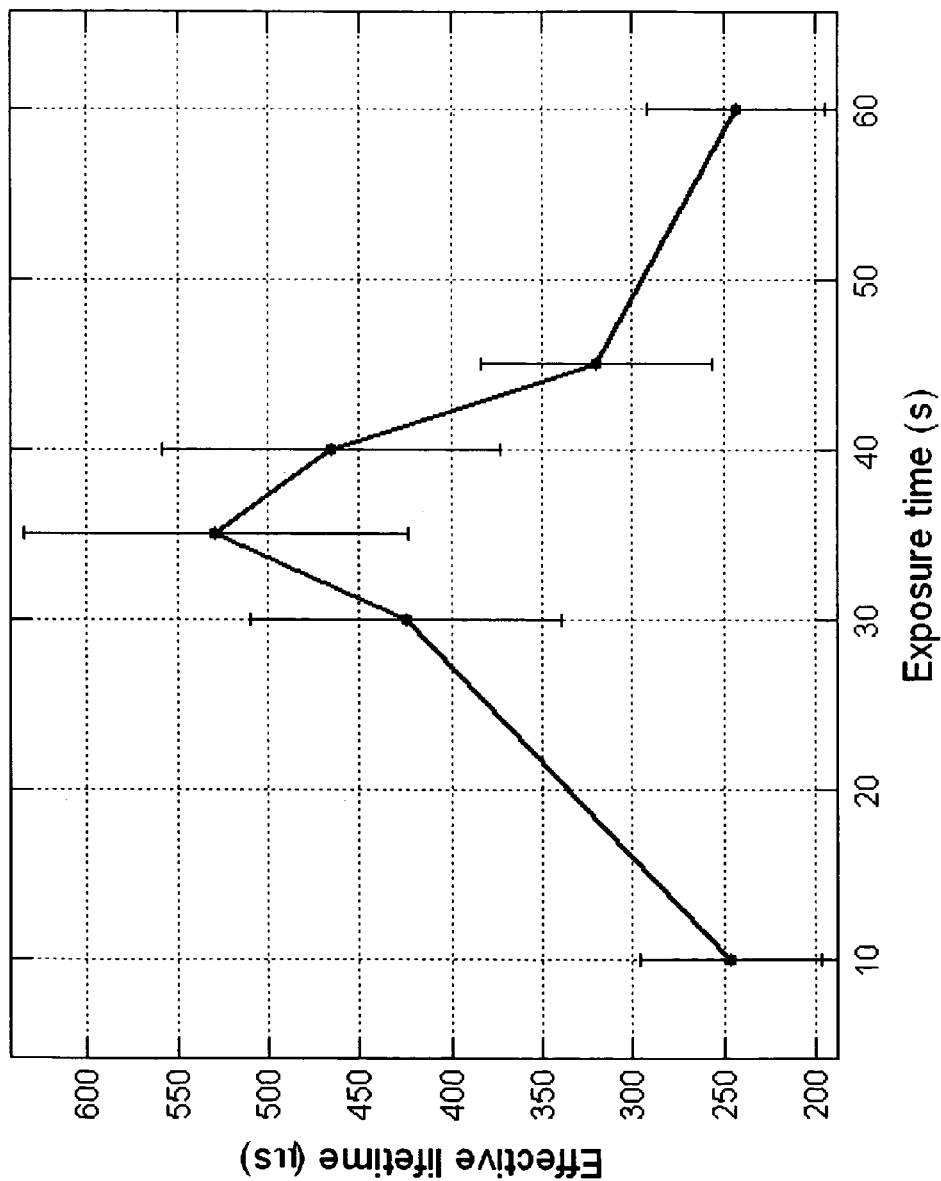

Important for the realization of the germanium cell with efficiencies as shown by the cell realized by application of the preferred embodiment, is thickness of the emitter and the applied surface passivation technique. FIG. 4 shows simulation results were the emitter thickness and surface recombination velocities have been varied, cell 1 has a simulated front surface recombination velocity ($S_{front}$) of 70000 cm/s and cell 2 has $S_{front}$ equal to 50 cm/s. With decreasing emitter depth and decreasing recombination velocity at the front surface the response of the cell improves.

While the above description has pointed out novel features of the invention as applied to various embodiments, the skilled person will understand that various omissions, substitutions, and changes in the form and details of the device or process illustrated may be made without departing from the scope of the invention. Therefore, the scope of the invention is defined by the appended claims rather than by the foregoing description. All variations coming within the meaning and range of equivalency of the claims are embraced within their scope.

The invention claimed is:

1. A method of passivating and contacting a surface of a germanium substrate, comprising, in sequence:
   (a) providing a germanium substrate having a first surface, wherein the first surface is a surface of an emitter;
   (b) forming a passivation layer of amorphous silicon or hydrogenated amorphous silicon on said first surface to passivate the surface of the emitter;
   (c) forming a contact layer of metal on said passivation layer; and thereafter
   (d) heating the substrate and layers at a temperature of from about 150° C. to less than 300° C., whereby particles of metal from the contact layer diffuse through the passivation layer to form a conductive path between the contact layer and the germanium emitter.

2. The method according to claim 1, wherein said contact resistivity is less than about $10^{-4}$ $\Omega cm^2$.

3. The method according to claim 1, further comprising cleaning said first surface before forming said passivation layer, said cleaning comprising applying a $H_2$ containing plasma to said first surface.

4. The method according to claim 1, wherein said forming said passivation layer is performed by plasma enhanced chemical vapor deposition (PECVD).

5. The method according to claim 4, wherein said PECVD is performed at a temperature of from about 150° C. to about 300° C.

6. The method according to claim 1, wherein said passivation layer has a thickness of less than about 100 nm.

7. The method according to claim 6, wherein said passivation layer has a thickness of less than about 40 nm.

8. The method according to claim 1, wherein said passivation layer has a thickness of from about 10 nm to about 50 nm.

9. The method according to claim 1, wherein said contact layer comprises Ag or Au.

10. The method according to claim 1, further comprising patterning the contact layer to form a contact grid, wherein patterning is performed after forming the contact layer of metal on said passivation layer and before heating the substrate and layers at a temperature of from about 150° C. to less than 300° C.

11. The method according to claim 1, wherein said heating is performed at a temperature of from about 160° C. to about 220° C.

12. The method according to claim 1, further comprising, before forming a passivation layer:
   forming an emitter area in said germanium substrate;
   forming a back contact on a second surface of said germanium substrate and thereby realizing a back surface field; and
   etching mesa structures so as to define photo voltaic cell regions.

13. The method according to claim 12, further comprising forming an antireflective coating on exposed parts of the passivation layer and the contact layer, wherein said forming an antireflective coating is performed after the heating.

14. A photovoltaic device comprising:
   a germanium substrate having a back surface, the germanium substrate further having therein an emitter, the emitter having a surface opposite the back surface of the germanium substrate;
   a back contact on said back surface of said germanium substrate providing a back surface field;
   a passivation layer of plasma enhanced chemical vapor deposition (PECVD) deposited amorphous silicon material formed on said emitter surface;
   a contacting layer comprising a conductive material formed on said passivation layer, wherein a conductive path is formed between the contacting layer and the emitter by particles of said conductive material having diffused into said passivation layer;
   photovoltaic cell regions; and
   an antireflective coating on exposed parts of said passivation layer and said contact layer.

15. The method according to claim 12, wherein a germanium solar cell, a thermophotovoltaic cell or a photodetector comprises the emitter.

* * * * *